May 23, 1967 R. G. LAUTTMAN 3,321,681
SEMICONDUCTOR CONSISTING OF PERYLENE IODINE COMPLEX JOINED TO A TETRACYANOQUINODIMETHANE COMPLEX TO FORM A P-N JUNCTION
Filed Oct. 6, 1965
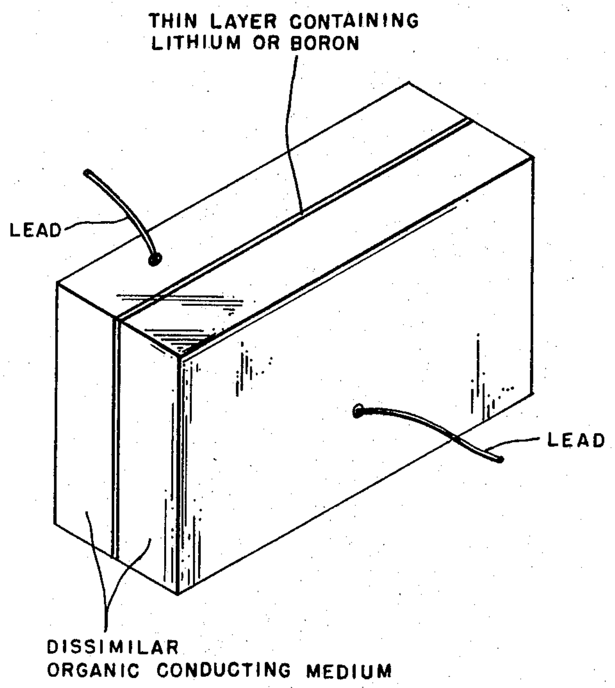
INVENTOR,
ROBERT G. LAUTTMAN
BY Harry M. Saragovitz, Edward J. Kelly, Herbert Berl & Julian C. Keppler
ATTORNEYS United States Patent Office 3,321,681

Patented May 23, 1967

3,321,681

SEMICONDUCTOR CONSISTING OF PERYLENE IODINE COMPLEX JOINED TO A TETRACYANOQUINODIMETHANE COMPLEX TO FORM A P-N JUNCTION

Robert G. Lauttman, Neptune, N.J., assignor to the United States of America as represented by the Secretary of the Army Filed Oct. 6. 1965, Ser. No. 493,592
1 Claim. (Cl. 317—234)

The invention described herein may be manufactured and used by or for the Government for governmental purposes without the payment of any royalty thereon.

This invention relates in general to joined dissimilar organic materials and in particular to joined dissimilar organic materials that can be used as an organic semiconducting electronic device.

Heretofore, semiconducting electronic devices have been made from inorganic materials such as germanium, silicon, indium, gallium phosphide, etc. These materials are sometimes difficult to grow or manufacture in a form suitable for electronic adaptation, and even when so manufactured are found to be fragile. In the case of dissimilar organic materials, no suitable means of making effective electrical contacts therebewteen or attached to them is known.

An object of this invention is to provide a semiconducting electronic device in which the aforementioned disadvantages are overcome. A further object of this invention is to provide joined dissimilar organic semiconducting materials that can be used as a semiconducting electronic device. Another object of the invention is to provide effective electrical contacts to organic semiconducting materials . A specific object of this invention is to provide dissimilar organic semiconducting materials that are chemically joined and and can be used as a semiconducting electronic device.

It has been found that the aforementioned objects can be obtained by providing a first organic semiconducting "acceptor-like" material and a second organic semiconducting "donor-like" material chemically bonded or joined together at their respective interfaces so that a junction is formed across which charge can be transferred. It is to be understood that "acceptor-like" and "donor-like" refer to acceptor and donor properties of inorganic materials.

It is considered that any of the many types of organic semiconducting materials can be used in the invention. Thus, the various aromatic hydrocarbons, aromatic hydrocarbons associated with ligands in molecular complexes or in organometallic compounds, and ion radical salts that exhibit semiconducting properties can be used in the invention. Thus, organic materials such as perylene, perylene iodine complex, perylene bromine complex, polyacrylonitrile, and many of the tetracyanoquinodimethane complexes can be used as the organic semiconducting material.

The manner in which the chemical bond is formed between a first and second organic semiconducting material and respective effective electrical contacts made thereto is illustrated in the following example.

*Example*

A layer of lithium about 0.1 mil in thickness is vacuum deposited onto one surface of a sample of tetracyanoquinodimethane complex, an acceptor-like material, which is about 10 mils in thickness. The layer of lithium can be conveniently obtained from the vacuum evaporation of a lithium containing compound such as lithium hydroxide. Then, a layer of lithium about 0.1 mil in thickness is vacuum deposited onto one surface of a sample of perylene iodine complex, a donor-like material, which is about 10 mils in thickness. The lithium coated surfaces of the two samples are pressed together by any suitable means and then placed in a nuclear reactor and subjected therein to slow neutrons for about 2 hours at an absorbed dose rate of about 500 megarads per hour. This causes the lithium to be activated and release alpha particles which have energies in the 1.5 and 2 mev. range. These positively charged alpha particles are stopped after travelling only a very short distance (microns or less) because of their strong electrostatic interaction with the negative electrons of the absorbing medium. This results in the deposition of large amounts of energy along each alpha particles path in extremely short intervals of time. This causes the temperature of the molecules along these paths to be raised many thousands of degrees and the chemical bonds in these areas to be broken. Upon cooling, other bonds reform at the interface, chemically binding the two dissimilar organics together and establishing a junction across which charge can be transferred. Concurrently, copper wire electrical contacts are affixed to the perylene iodine complex and tetracyanoquinodimethane complex by the same method as described above for forming the junction. That is, the particular area of the organic semiconducting material to be electrically contacted is coated with a layer of lithium about 0.1 mil in thickness by vacuum deposition as is the tip of copper wire to be electrically contacted to that area of the organic semiconducting material. The coated surfaces are pressed together, then placed in a nuclear reactor, and subjected therein to slow neutrons as above described. When the copper wire leads are joined to any electronic circuitry or power supply, a voltage can be applied to the device, and the device will exhibit conventional transistor and diode functions.

The device of the foregoing example is illustrated in the accompanying drawing.

In the foregoing example, a boron compound can be substituted for the lithium compound as the alpha particle releasing source. Moreover, other varieties of nuclear or thermal or chemical treatments can be used which will also produce junctions across which charge can be transferred. For example, positive ion injection or charge injection into these organics over a variable energy range may also establish junctions.

As can be readily seen, the above described method can be used to make an unlimited number of extremely good electrical contacts between various organic materials eliminating the difficulty of contact potentials arising because a contact was made improperly or because of contamination of the organic material due to the use of flux.

The joined organic materials of the invention, of course, are useful as semiconducting transistors and diodes.

The foregoing description is to be considered merely as illustrative of the invention and not in limitation thereof.

What is claimed is:

An organic semiconducting electronic device comprising, perylene iodine complex as a first organic semiconducting acceptor like material and tetracyanoquinodimethane complex as a second organic semiconductor donor like material, said semiconducting materials being chemically bonded together at their respective interfaces so that a junction is formed across which charge can be transferred, said first and second organic semiconducting materials having respective electrical contacts chemically bonded to their respective outer faces.

References Cited by the Examiner

UNITED STATES PATENTS

| | | | |
|---|---|---|---|
| 3,231,500 | 1/1966 | Frant et al. | 252—62.3 |
| 3,249,830 | 5/1966 | Adany | 317—234 |

OTHER REFERENCES

Fox et al.: I.R.E.E., June 1962, 8th Scintillation Counter Symposium.

JOHN W. HUCKERT, *Primary Examiner.*

M. EDLOW, *Assistant Examiner.*